(12) United States Patent
Sakuma et al.

(10) Patent No.: US 7,071,511 B2
(45) Date of Patent: Jul. 4, 2006

(54) NONVOLATILE SEMICONDUCTOR MEMORY DEVICE HAVING ADJACENT SELECTION TRANSISTORS CONNECTED TOGETHER

(75) Inventors: Makoto Sakuma, Yokohama (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 2 days.

(21) Appl. No.: 10/988,534

(22) Filed: Nov. 16, 2004

(65) Prior Publication Data

US 2006/0060911 A1    Mar. 23, 2006

(30) Foreign Application Priority Data

Sep. 21, 2004    (JP) .............................. 2004-273793

(51) Int. Cl.
*H01L 29/788* (2006.01)
(52) U.S. Cl. ........................................ 257/316; 257/315
(58) Field of Classification Search ................ 257/315, 257/316
See application file for complete search history.

(56) References Cited

U.S. PATENT DOCUMENTS 6,191,975 B1 *  2/2001  Shimizu et al. ........ 365/185.17
6,835,987 B1 * 12/2004  Yaegashi ..................... 257/391

2004/0164340 A1    8/2004  Fumitaka et al.

FOREIGN PATENT DOCUMENTS

| JP | 11-145429 | 5/1999 |
|---|---|---|
| JP | 2002-50703 | 2/2002 |
| JP | 2002-217318 | 8/2002 |

OTHER PUBLICATIONS

Y, Sasago, et al., "10-MB/s Multi-Level Programming of Gb-Scale Flash Memory Enabled by New AG-AND Cell Technology", 2002 IEEE, 952-IEDM, 21.6.1, 2002, 3 Pages.

* cited by examiner

*Primary Examiner*—Andy Huynh
(74) *Attorney, Agent, or Firm*—Oblon, Spivak, McClelland, Maier & Neustadt, P.C.

(57) ABSTRACT

A semiconductor memory device comprising a semiconductor substrate, a plurality of cell transistors provided on the substrate, a plurality of selection gates provided on the substrate, and element-isolation regions provided between the cell transistors and between the selection gates. Each cell transistor has a floating gate provided on a gate insulating film provided on the substrate, a source and drain provided in the substrate and aligned with the sides of the floating gate, an inter-gate insulating film provided on one side of the floating gate, and a control gate provided on the inter-gate insulating film and laying over the one side of the floating gate. The selection gates are connected by conductive members which are provided on the gate insulating film and embedded in the selection gates.

9 Claims, 9 Drawing Sheets

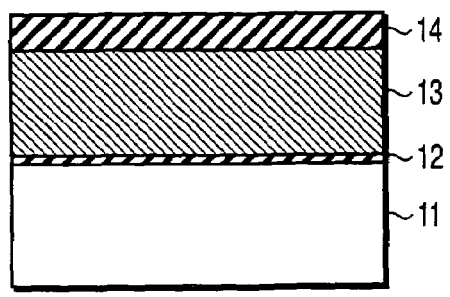
F I G. 4A
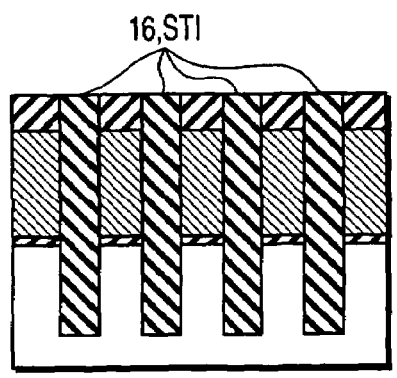
F I G. 4B
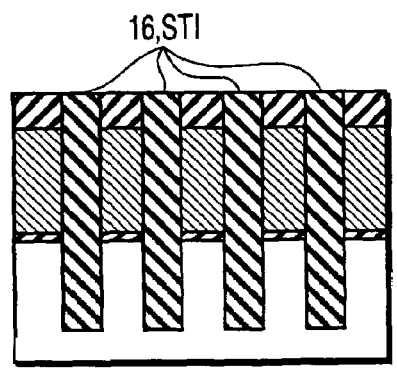
F I G. 4C
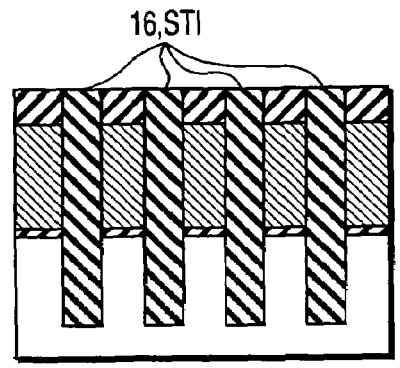
F I G. 4D
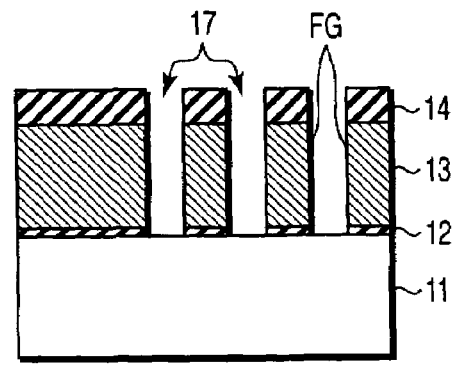
F I G. 5A
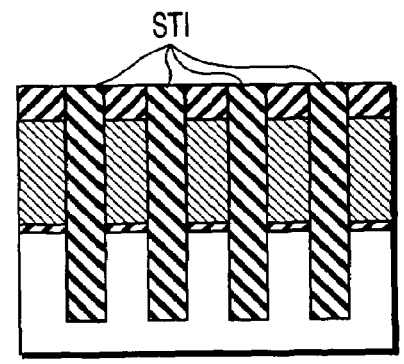
F I G. 5B
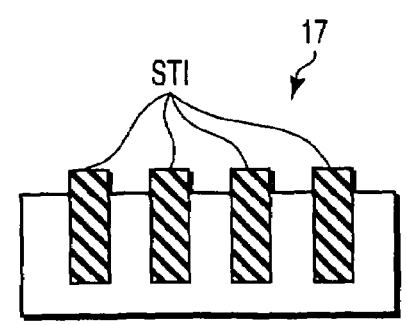
F I G. 5C
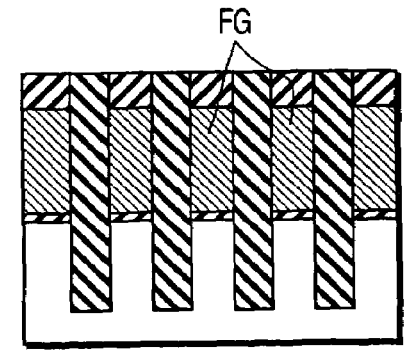
F I G. 5D

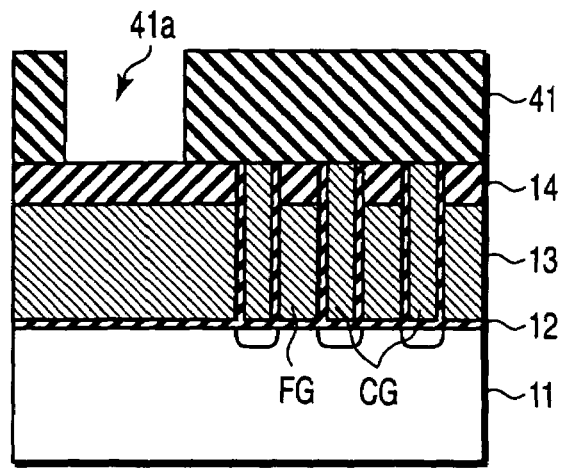
F I G. 15A
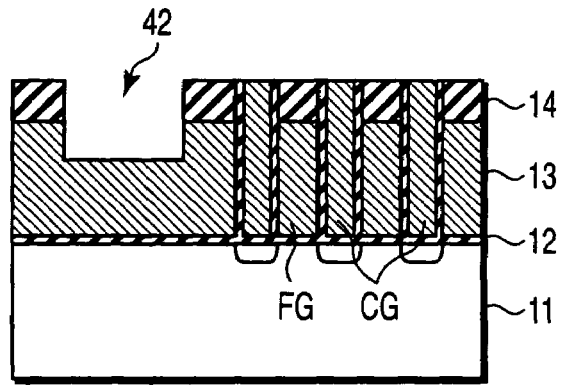
F I G. 15B
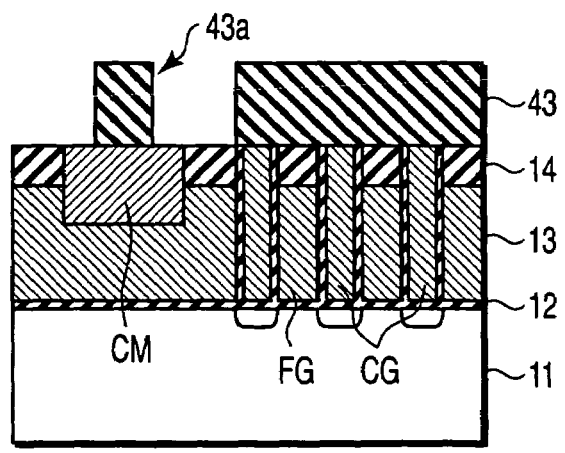
F I G. 15C
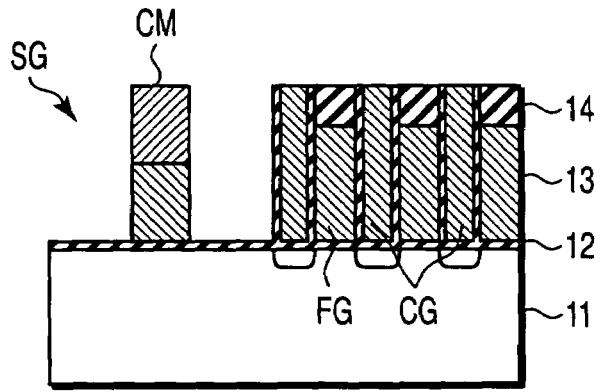
F I G. 15D

NONVOLATILE SEMICONDUCTOR MEMORY DEVICE HAVING ADJACENT SELECTION TRANSISTORS CONNECTED TOGETHER

CROSS-REFERENCE TO RELATED APPLICATIONS

This application is based upon and claims the benefit of priority from prior Japanese Patent Application No. 2004-273793, filed Sep. 21, 2004, the entire contents of which are incorporated herein by reference.

BACKGROUND OF THE INVENTION

1. Field of the Invention

This invention relates to a nonvolatile semiconductor device that has, for example, floating gates.

2. Description of the Related Art

Most NAND-type nonvolatile semiconductor memories have EEPROM cells, or cell transistors. A group of cell transistors are connected in series, having a common source-drain region. Each cell transistor has a multi-layered gate structure, having a floating gate and a control gate. The control gate is formed on a gate insulating film that is provided on the floating gate. Cell transistors of a group share one floating gate, which serves as a word line. The floating gates of any adjacent cell transistors are spaced apart and electrically isolated. The cell transistors connected in series constitute a NAND cell. The ends of the NAND cell are connected to two selection transistors, respectively. One selection transistor connects one end of the NAND cell to a bit line. The other selection transistor connects the other end of the NAND cell to a source line. Electrons are injected into the floating gate common to the cell transistors by applying a high write potential to the control gates of the cell transistors and connecting the substrate to the ground.

As cell transistors become smaller and smaller, the parasitic capacitance between any adjacent cell transistors increases. So does the parasitic capacitance between the floating gate of each cell transistor and the structure peripheral to the cell transistor. The write voltage to be applied to each cell transistor must be increased to write data at high speed. In order to increase the write voltage, the control gates of the cell transistors must be sufficiently insulated against the write voltage and the word-line drive circuit must be greatly resistant to the write voltage. This makes it difficult to increase the packing density of memory elements and raise the operating speed thereof.

In view of this, it has been proposed that the floating gate and control gate of each cell transistor be changed in structure to lower the write voltage.

For example, a NAND-type EEPROM has been developed, in which the capacitance between the booster plate and the floating gate of each cell transistor is increased. Thus, data can be written into, erased in and read from, this NAND-type EEPROM at a low voltage (See, for example, Jpn. Pat. Appln. KOKAI Publication No. 11-145429).

A nonvolatile memory element has been developed, in which the coupling ratio between the floating gate and the control gate is increased, thus lowering the write voltage. The memory element can therefore be small. (See, for example, Jpn. Pat. Appln. KOKAI Publication No. 2002-217318.)

A nonvolatile semiconductor memory having MOSFETs used as cell transistors has been developed. In this memory, each MOSFET has two floating gates provided on the sides of the control gate. These floating gates help to improve the data-writing, -erasing and -reading characteristics of the memory. (See, for example, Jpn. Pat. Appln. KOKAI Publication No. 2002-50703.)

So-called AG-AND memory cells have been developed. (See, for example, 10-MB/s Multi-Level Programming of Gb-Scale Flash Memory Enabled by New AG-AND Cell Technology, 2002 IEEE, 952-IEDM, 21.6.1.) The AG-AND memory cell has an assistant gate that is located adjacent to the floating gate.

In NAND-type nonvolatile semiconductor memories comprising each comprising cell transistors, each having a floating gate and a control gate laid one above the other, the selection gates have the same structure as the cell transistors. That is, each selection gate comprises a floating gate and a control gate electrically connected to the floating gate. Hence, the selection gates arranged along any word line can be connected together if their control gates are connected to one another.

If each cell transistor has two floating gates that are provided on the sides of the control gate, however, shallow trench isolation (STI) is provided between any two selection gates arranged along a word line. This makes it difficult to connect the selection gates.

BRIEF SUMMARY OF THE INVENTION

According to a first aspect of the invention, there is provided a semiconductor memory device that comprises: a semiconductor substrate; a plurality of first cell transistors which are arranged in rows and columns on the semiconductor substrate; a plurality of first selection gates which are provided on the semiconductor substrate and select rows of first transistors; and element-isolating regions which are provided adjacent to columns of the first selection gates and columns of the first cell transistors and which isolate the first selection gates and the first cell transistors. Each of the first cell transistors includes: a floating gate which is formed on a gate insulating film provided on the semiconductor substrate; source-drain regions which are provided in the semiconductor substrate and formed on those sides of the floating gate which face each other in a column direction; an inter-gate insulating film which is provided on one side of the floating gate; and a control gate which is provided on the inter-gate insulating film and above those sides of the floating gate which face each other in the column direction. Each of the first selection gates is provided on the gate insulating film, has a mask layer made of insulating film and provided on the top, a trench made in the mask layer and a conductive member provided in the trench, and is connected to adjacent first selection gates by the conductive member.

According to a second aspect of the invention, there is provided a method of manufacturing a nonvolatile semiconductor memory device, comprising: forming a gate insulating film on a semiconductor substrate; forming a first conductive layer on the gate insulating film; forming a mask on the first conductive layer; forming a plurality of element-isolating regions in the mask layer, first conductive layer, gate insulating film and semiconductor substrate; making a plurality of first trenches in those parts of the first conductive layer which have been separated by the element-isolating region, the first conductive layer providing a plurality of floating gates; forming inter-gate insulating films on sides of each floating gate; forming second conductive layers in the first trenches, thereby forming control gates; making second trenches in those parts of the mask layer and first conductive layer in which selection gates should be formed, and in those parts of the element-isolating regions which are adjacent to the parts of the mask layer and first conductive layer; forming conductive members in the second trenches; and removing the first conductive layer and the gate insulating film, except those parts which include the conductive members.

BRIEF DESCRIPTION OF THE SEVERAL VIEWS OF THE DRAWING

FIGS. 4A to 4D are sectional views, explaining the steps of manufacturing the memory, which follow the steps of FIGS. 3A to 3D, respectively;

FIGS. 5A to 5D are sectional views, explaining the steps of manufacturing the memory, which follow the steps of FIGS. 4A to 4D, respectively;

FIGS. 15A to 15D are sectional views, explaining a method of manufacturing a semiconductor memory according to a second embodiment of this invention.

DETAILED DESCRIPTION OF THE INVENTION

Embodiments of the present invention will be described, with reference to the accompanying drawings.

Figure 1A:
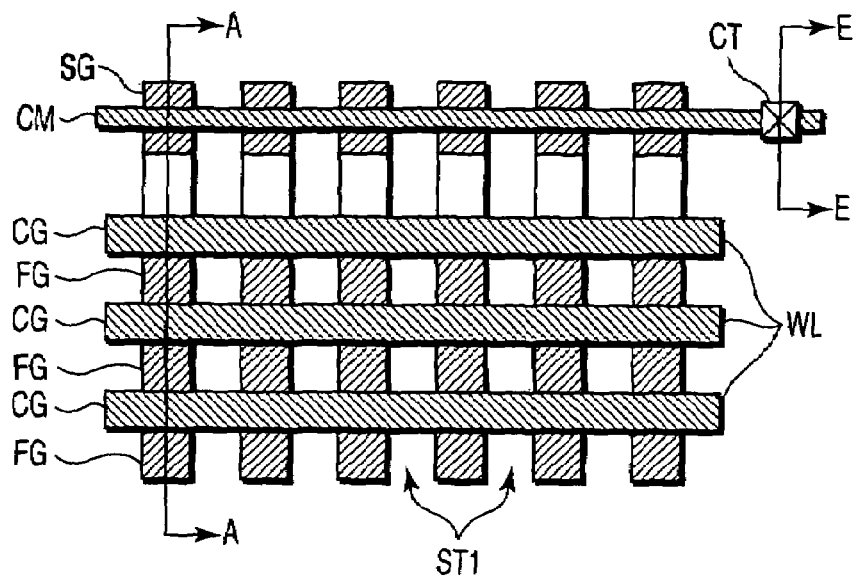
FIG. 1A is a plan view showing of a NAND-type nonvolatile semiconductor memory according to a first embodiment of this invention.
Figure 1B:
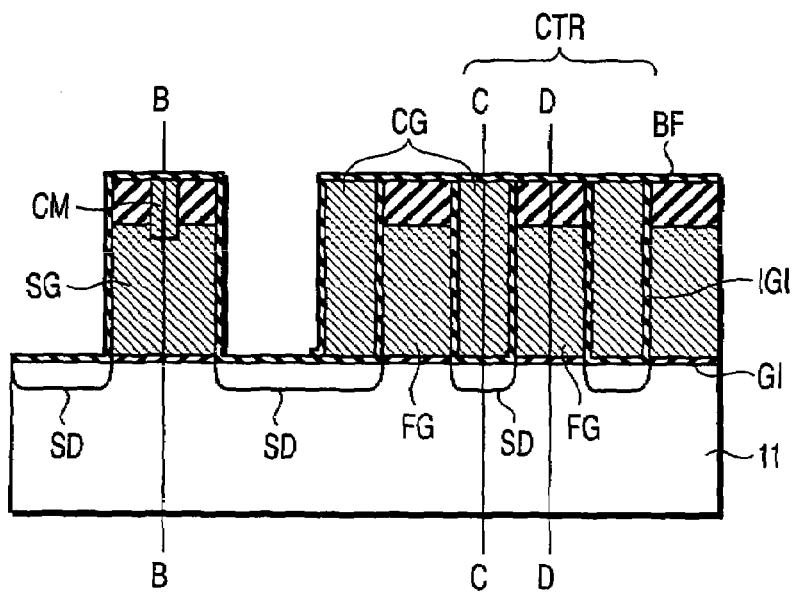
FIG. 1B is a sectional view taken along line A—A in FIG. 1.

FIG. 1A is a plan view of a nonvolatile semiconductor memory according to the first embodiment of the invention. FIG. 1B is a sectional view, taken along line A—A shown in FIG. 1A. As FIGS. 1A and 1B show, a gate insulating film GI is provided on a semiconductor substrate 11. The gate insulating film GI is used as a tunnel insulating film. On this film GI there is formed a plurality of floating gates FG. Source-drain regions SD are provided in those surface regions of the substrate 11 which lie between the floating gates FD. Any adjacent source-drain regions SD are connected, forming an NAND cell. An inter-gate insulating film IGI is provided between on either side of each floating gate FG and on that part of the gate insulating film GI which lies between the adjacent floating gates FG. A control gate CG is formed on the inter-gate insulating film IGI provided on either side of each floating gate FG. Each floating gate FG and the source-drain region SD and control gate CG provided on the floating gate FG constitute a cell transistor CTR.

Two selection gates SG are formed at the ends of each NAND cell, respectively. Both selection gates SG function as selection transistors. Note that only one selection gate SG is shown in FIGS. 1A and 1B. Either selection gate SG is almost identical to the floating gates FG in structure. In those surface regions of the substrate 11 which lie beside the selection gate SG, two source-drain regions SD are provided. One source-drain region SD is connected to the adjacent source-drain region SD of the NAND cell. The other source-drain region SD is connected to a bit line (not shown) or a source line (not shown). A barrier film BF covers the NAND cell and the selection gate SG.

As FIG. 1A shows, stripe-shaped STIs are formed between the NAND cells and selection gates SG. The STIs are provided as element-isolating regions. The control gates CG extend over the STIs. Each control gate CG is connected to either adjacent control gate CG. The control gates CG constitute word lines WL.

Figure 1C:
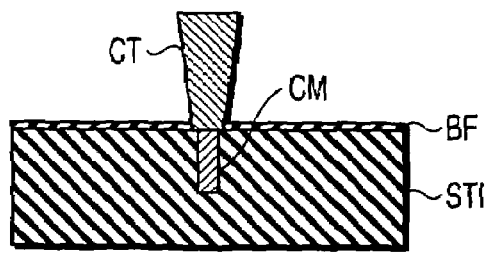
FIG. 1C is a sectional view taken along line E—E in FIG. 1.
Figure 2A:
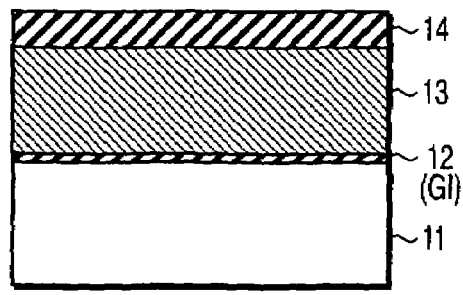
FIGS. 2A to 2D explain a method of manufacturing an NAND-type nonvolatile semiconductor memory according the first embodiment, FIG. 2A being a sectional view taken along line A—A in FIG. 1A, FIG. 2B being a sectional view taken along line B—B in FIG. 1B, FIG. 2C being a sectional view taken along line C—C in FIG. 1B, and FIG. 2D being a sectional view taken along line D—D in FIG. 1B.
Figure 2B:
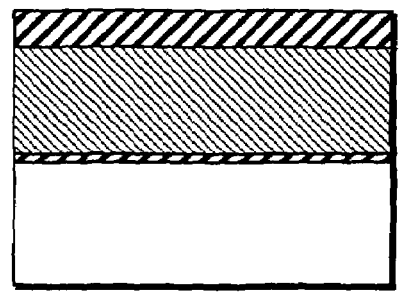
Figure 2C:
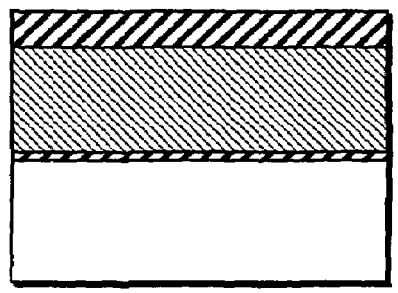
Figure 2D:
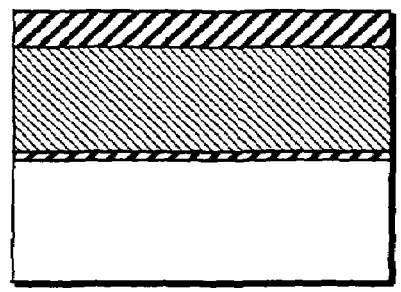

The selection gates SG arranged in parallel to the word lines WL are connected by a conductive member CM, or a selection-gate line. As seen from FIG. 1B, the conductive member CM is provided in a trench made in a STI (not shown). One end of the conductive member CT is connected to a contact CT. As FIG. 1C shows, the contact CT is provided on an STI that has a flat surface and is connected to the conductive member CM.

A method of manufacturing the nonvolatile semiconductor memory described above will be explained with reference to FIGS. 2A to 12D. FIGS. 2A to 12A are sectional views taken along line A—A in FIG. 1. FIGS. 2B to 12B are sectional views taken along line B—B in FIG. 1. FIGS. 2C to 12C are sectional views taken along line C—C in FIG. 1. FIGS. 2C to 12C are sectional views taken along line C—C in FIG. 1. FIGS. 2D to 12D are sectional views taken along line D—D in FIG. 1.

As FIGS. 2A to 2D show, a gate insulating film 12 (G1) made of, for example, silicon oxide is formed on a semiconductor substrate 11 that is made of, for example, silicon. On the gate insulating film 12 there is formed a polysilicon layer 13, which will be processed to provide floating gates FG. Then, a mask layer 14 is then formed on the polysilicon layer 13. The mask layer 14 is made of, for example, polysilicon nitride. It is desired that the mask layer 14 should exhibit a large selection ratio in chemical mechanical polishing (CMP), with respect to a buried material which composes STI, and should exhibit a large selection ratio in dry etching, with respect to the material of control gates, such as polysilicon.

Figure 3A:
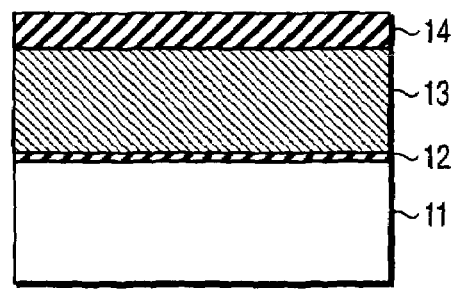
FIGS. 3A to 3D are sectional views, explaining the steps of manufacturing the memory, which follow the steps illustrated in FIGS. 2A to 2D, respectively.
Figure 3B:
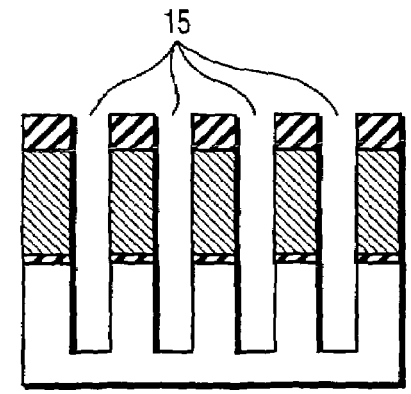
Figure 3C:
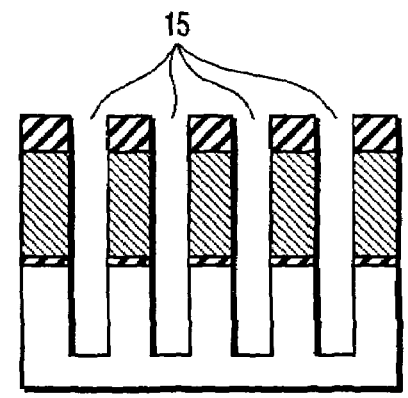
Figure 3D:
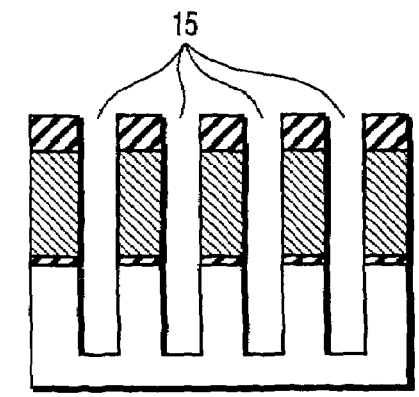

Next, as FIGS. 3B to 3D depict, the mask layer 14, polysilicon layer 13, gate insulating film 12 and semiconductor substrate 11 are etched by using a mask pattern (not shown). Element-isolating trenches 15 are thereby made.

As illustrated in FIGS. 4A to 4D, the trenches 15 are filled with insulating films 16 made of, for example, silicon oxide. Then, the insulating films 16 are made flat, at the top, by means of, for example, CMP in which the mask layer 14 is used stopper. As a result, STIs are formed.

Thereafter, as FIGS. 5A and 5C show, those parts of the mask layer 14, polysilicon layer 13, gate insulating film 12 in which control gates should be formed, and those parts of the STIs which are adjacent to the control gates, are removed by means of dry etching. Thus, trenches 17 are made. Control gates and word lines will be provided in these trenches 17. When the trenches 17 are made, floating gates FG are formed. The trenches 17 extend at right angles to the STIs. As seen from FIG. 5C, the polysilicon layers 13 are removed from the gate insulating film 12 in the trenches 17. The STIs therefore protrude a little from the gate insulating film 12.

Figure 6A:
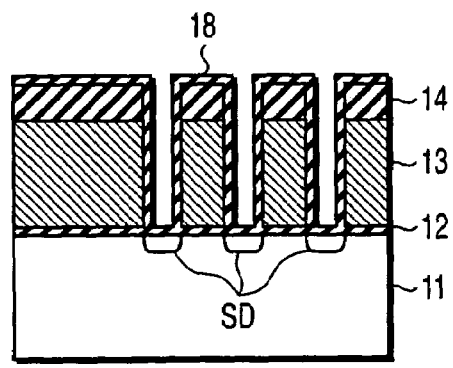
FIGS. 6A to 6D are sectional views, explaining the steps of manufacturing the memory, which follow the steps of FIGS. 5A to 5D, respectively.
Figure 6B:
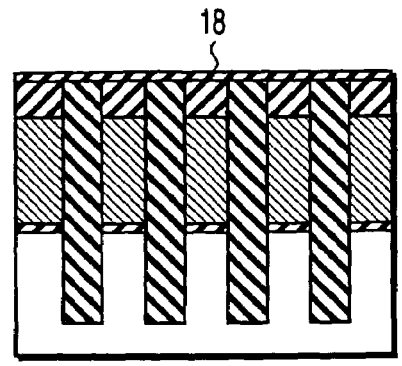
Figure 6C:
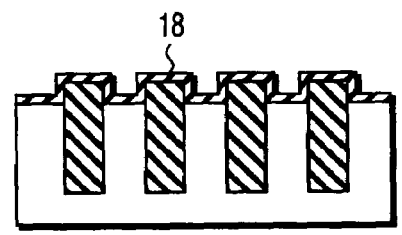
Figure 6D:
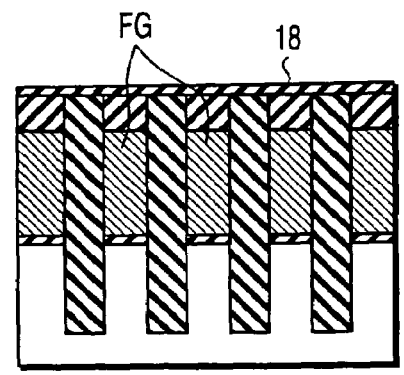

Next, as FIGS. 6A to 6D show, an inter-gate insulating film 18 is formed on the entire upper surface of the resultant structure. This insulating film 18 is an ONO film that is composed of an oxide film, a nitride film formed on the oxide film and another oxide film formed on the nitride film. Thus, inter-gate insulating films are formed on the sides of each floating gate FG as is illustrated in FIG. 6A. As FIG. 6C shows, the inter-gate insulating film 18 is formed on the bottom of the trench 17 in which a word line will be formed. Then, a mask pattern (not sown) is laid on the entire upper surface of the resultant structure, except the regions lying between the floating gates FG. Through this mask pattern, impurity ions are implanted into those parts of the substrate 11 which lie between the floating gates FG. Source-drain regions SD are thereby formed in the upper surface of the substrate 11 as is depicted in FIG. 6A. Note that the impurity ions can be implanted without using any mask pattern.

Figure 7A:
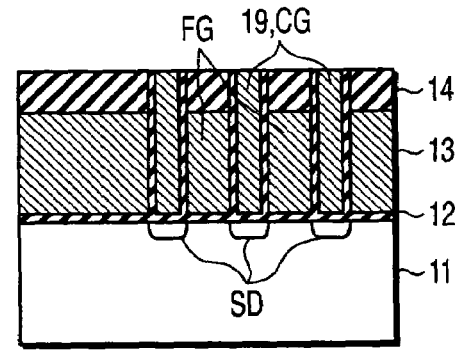
FIGS. 7A to 7D are sectional views, explaining the steps of manufacturing the memory, which follow the steps of FIGS. 6A to 6D, respectively.
Figure 7B:
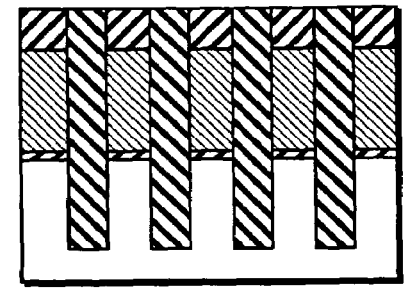
Figure 7C:
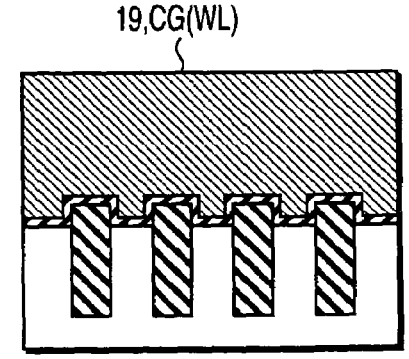
Figure 7D:
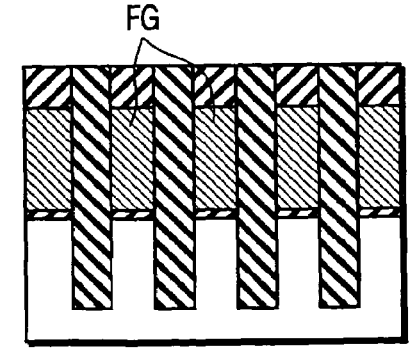

Subsequently, as shown in FIGS. 7A to 7D, a polysilicon layer 19, for example, is formed on the entire upper surface of the structure. The polysilicon layer 19 is made flat at the top, by means of CMP or dry etching, in which the mask layer 14 is used as stopper. Thus, control gates CG are formed on the sides of each floating gate FG as shown in FIG. 7A. As FIG. 7C shows, the control gates CG are connected, one to adjacent ones, on the STIs, to form a word line.

Figure 8A:
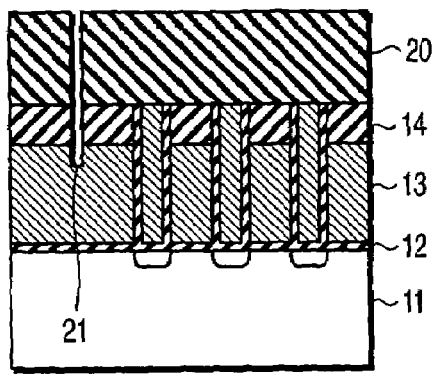
FIGS. 8A to 8D are sectional views, explaining the steps of manufacturing the memory, which follow the steps of FIGS. 7A to 7D, respectively.
Figure 8B:
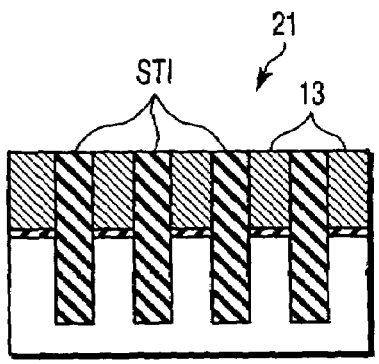
Figure 8C:
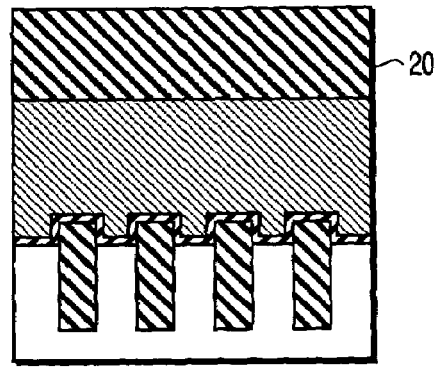
Figure 8D:
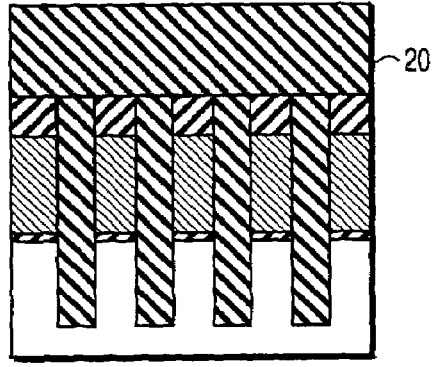

Next, as FIG. 8A shows, a mask pattern 20 is formed on the upper surface of the resultant structure. This mask pattern 20 has an opening exposing that part of the mask layer 14 in which a conductive member will be formed to connect selection gates to one another. Using the mask pattern 20 as mask, etching is performed on those parts of the mask layer 14, polysilicon layer 13 and STIs, which lie in the selection-gate regions. A trench 21 is thereby formed. Thus, as FIG. 8B shows, the polysilicon layer 13 and the STIs have their tops made flat at the bottom of the trench 21.

Figure 9A:
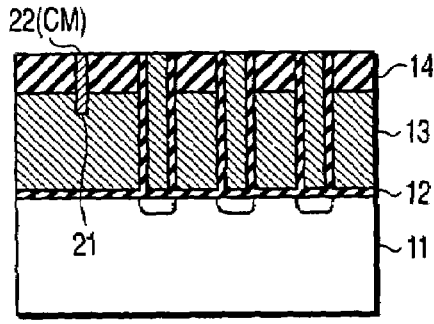
FIGS. 9A to 9D are sectional views, explaining the steps of manufacturing the memory, which follow the steps of FIGS. 8A to 8D, respectively.
Figure 9B:
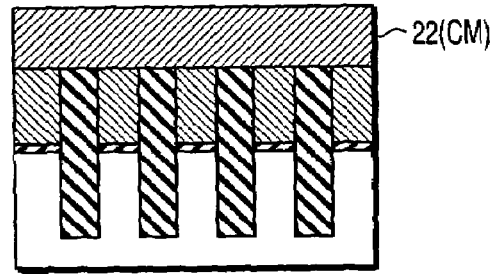
Figure 9C:
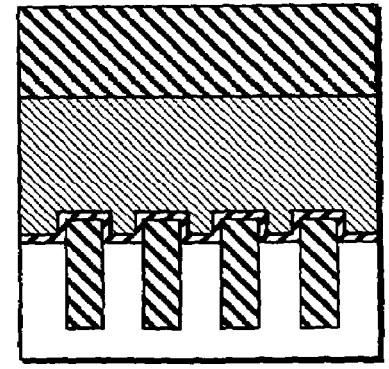
Figure 9D:
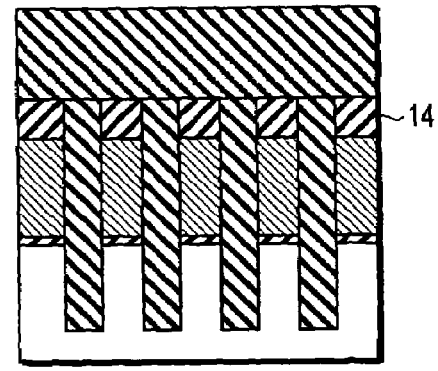

Subsequently, as FIGS. 9A and 9B show, a polysilicon layer 22, for example, is formed in the trench 21. The polysilicon layer 22 is made flat at its top by, for example, etching. As a result, the top of the layer 22 lies at the same level as the upper surface of the mask layer 14. The polysilicon layer 22 thus processed makes conductive member CM. The material of the conductive member CM is not limited to polysilicon. Rather, the conductive member CM may be made of low-resistance material such as tungsten silicide. It should be noted that a thin natural oxide film exists between the polysilicon layers 13 and 22. However, this oxide film can conduct electricity.

Figure 10A:
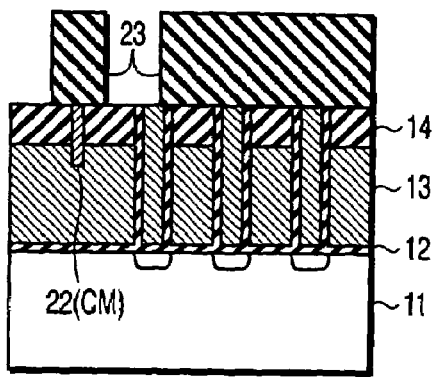
FIGS. 10A to 10D are sectional views, explaining the steps of manufacturing the memory, which follow the steps of FIGS. 9A to 9D, respectively.
Figure 10B:
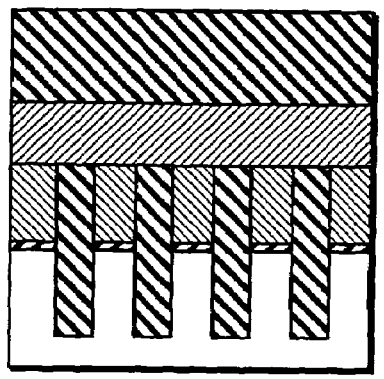
Figure 10C:
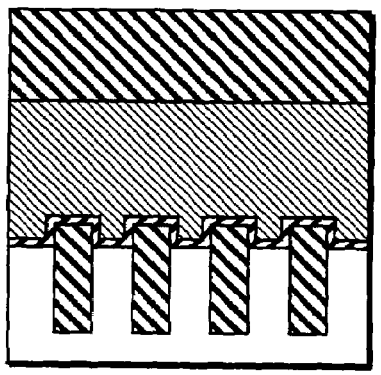
Figure 10D:
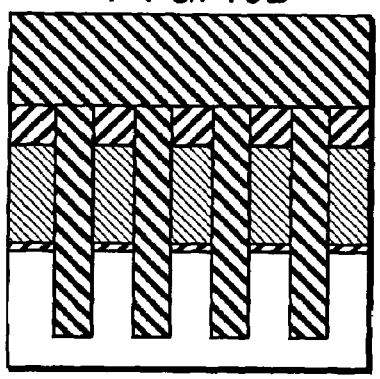

Thereafter, as FIGS. 10A and 10B depict, a mask pattern 23 is formed on the selection gate (SG) region. This mask pattern 23 has the same width as the selection gate SG and covers the conductive member CM.

Figure 11A:
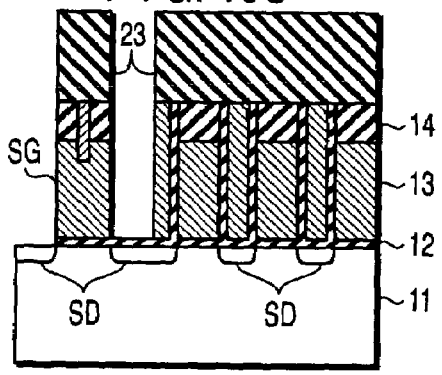
FIGS. 11A to 11D are sectional views, explaining the steps of manufacturing the memory, which follow the steps of FIGS. 10A to 10D, respectively.
Figure 11B:
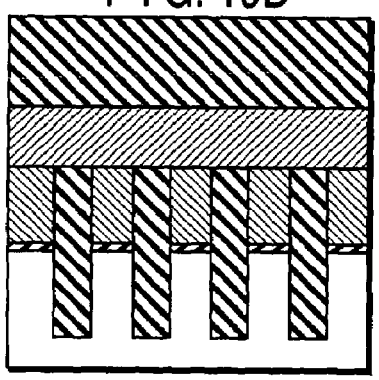
Figure 11C:
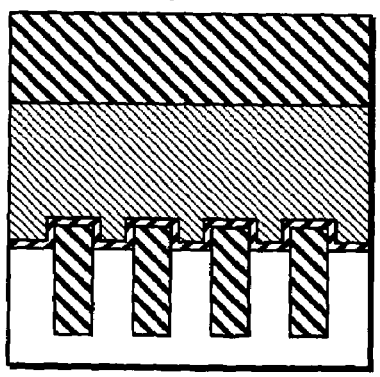
Figure 11D:
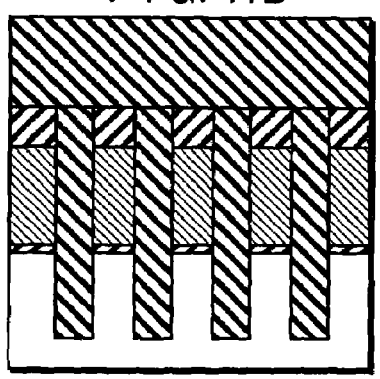
Figures 12A, 12B:
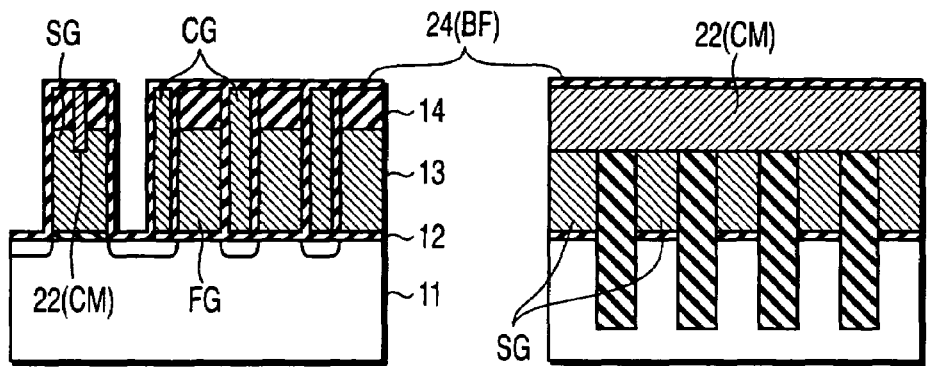
FIGS. 12A to 12D are sectional views, explaining the steps of manufacturing the memory, which follow the steps of FIGS. 11A to 11D, respectively.
Figures 12C, 12D:
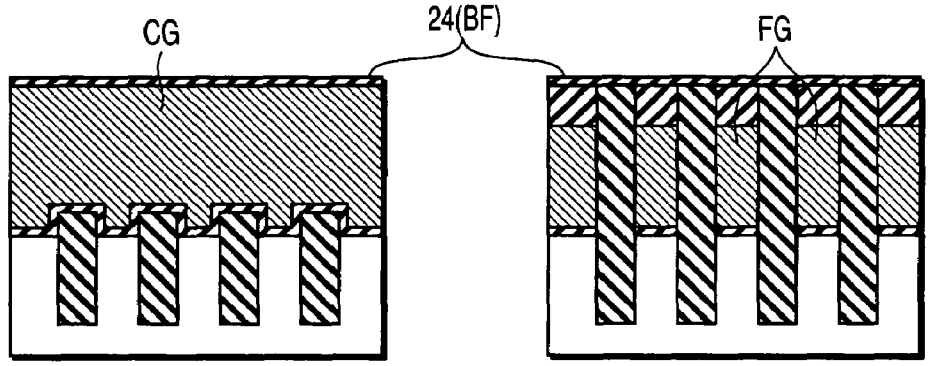

Next, as FIG. 11A shows, the mask layer 14, polysilicon layer 13 and gate insulating film 12 are etched by using the mask pattern 23 as mask. A selection gate SG is thereby formed. Using the selection gate SG as mask, impurity ions are implanted into the semiconductor substrate 11, thus forming a source-drain region SD. The selection gate SG and the source-drain region SD constitute a selection transistor.

As FIGS. 12A to 12D show, the mask pattern 23 is removed. A barrier film 24 is then formed on the entire upper surface of the resultant structure.

In the first embodiment, a trench 21 is formed, penetrating the selection gates SG and the STI, which are arranged along a word line. In the trench 21, a conductive member is formed, connecting the selection gates SG. The selection gates SG can, therefore, be easily connected in the NAND-type nonvolatile semiconductor memory in which control gates CG are provided on the sides of each floating gate.

Moreover, the barrier film BF provided on the STIs are flat as shown in FIG. 1C, because the conductive member CM has its top lying at the surface of the flat STIs. The conductive member CM and the contact CT can therefore contact each other in almost the same plane, only if the etching is temporarily stopped at the flat barrier film BF in the process of making a hole in the insulating film (not shown), in which the contact is formed. This makes it unnecessary to form a fringe for connecting the contact CT to an end of each selection gate SG. Hence, the contact CT can be very small, and an increase in chip area can be minimized.

Figure 13A:
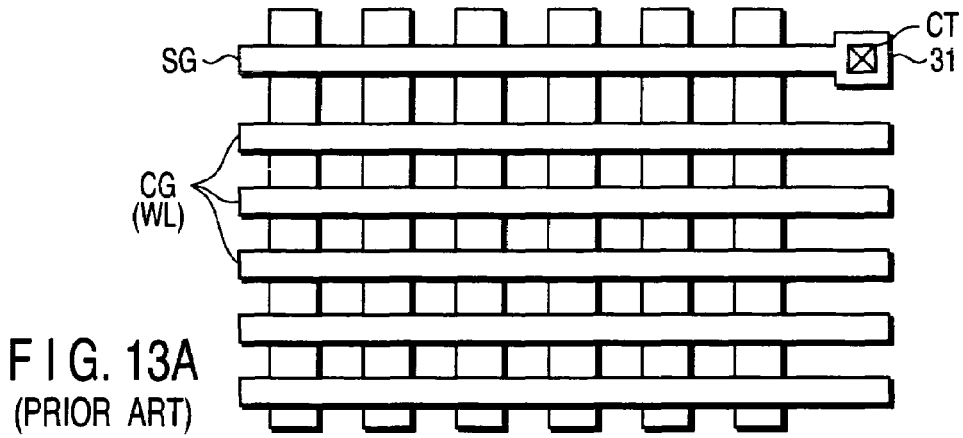
FIG. 13A is a plan view of a conventional NAND-type nonvolatile semiconductor memory.
Figure 13B:
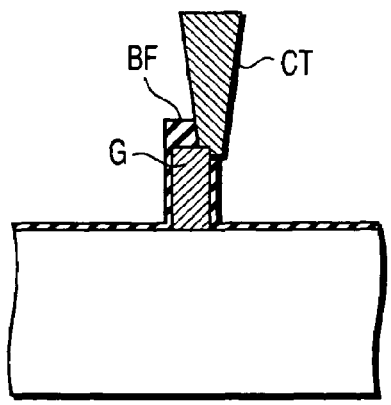
FIG. 13B is a sectional view, showing a gate electrode and a contact, which the semiconductor memory of FIG. 13A may have.

In the cell structure having a floating gate and a control gate laid on the floating gate, the barrier film BF covers the top and sides of the gate electrode G as is illustrated in FIG. 13B. The barrier film BF has the same shape as the gate electrode G. This renders it difficult to stop the etching at the barrier film provided on the gate electrode G when an opening is made in the insulating film (now shown) in the process of forming the contact CT that will be connected to the gate electrode G. A region outside the gate electrode G is inevitably over-etched, making small holes as shown in FIG. 13B, if the mask is not aligned as desired or if the diameter of the contact increases. In this case, no uniform barrier metal layer can be later formed in the opening, and no barrier metal layer may be formed in the small holes. This is a large fringe 31 is formed and the contact CT is provided at this fringe 31. Hitherto, the contact is provided above the region in which a transistor is formed. The voltage-resistance of the gate oxide film must therefore be taken into consideration. In the first embodiment, the contact is provided above an STI in which no transistors are formed. Hence, it is unnecessary to take into account the voltage-resistance of the gate oxide film. The contact can, therefore, be formed easily.

The selection gate SG has been formed by photolithography, independently of the floating gates and control gates. It is therefore possible to set the size and position of each selection gate SG.

Further, in the first embodiment, the diffusion layer of every cell and the diffusion layer of every selection gate are formed in separate processes as is illustrated in FIG. 6 and FIG. 11. Therefore, the cell transistors can acquire optimum characteristics, and so can the selection transistors.

The source-drain regions SD of the cell transistors are formed after the inter-gate insulating films are formed. The time of forming the source-drain regions SD is not limited to this. The source-drain regions SD may be formed after the floating gates FG are formed, as indicated by broken lines in FIG. 5A.

Figure 14:
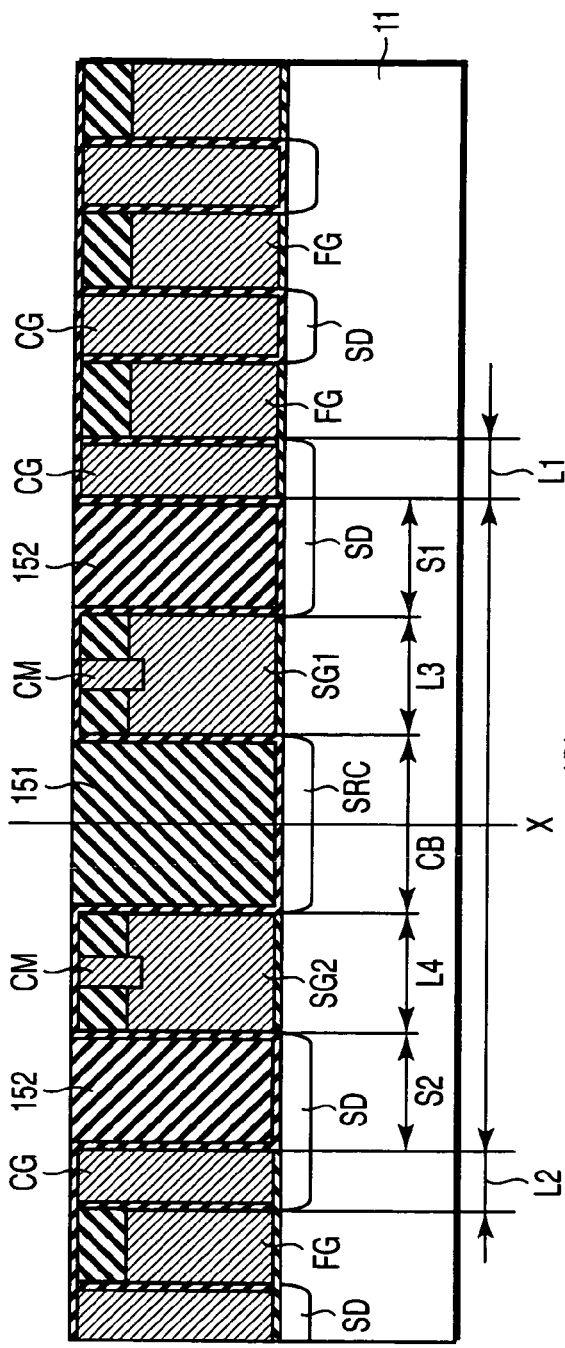
FIG. 14 is a sectional view, explaining the step of manufacturing the memory, which follows the step shown in FIG. 12A.

As FIG. 14 depicts, the cell transistors and selection transistors constituting a memory-cell array are arranged symmetrically with respect to, for example, the center X of a source line SRC. More precisely, the selection gates SG1 and SG2 are provided at the sides of the source line SRC, and the cell transistors are located at those sides of the selection gates SG1 and SG2 which face away from the source line. The region CB between the selection gates SG1 and SG2, the region S1 between the selection gate SG1 and the cell transistor, and the region between the selection gate SG2 and the cell transistor are etched by photolithography as is illustrated in FIGS. 10A to 10D. A mask-alignment error may be made in this etching. This error changes the widths L1 and L2 of the control gates of the two cell transistors that lie adjacent to the selection gates SG1 and SG2, but does not change the widths L3 and L4 of the selection gates. It follows that the difference between the width L1 and L2 is smaller than the difference between the widths L3 and L4.

The insulating material 151 filled in the region CB that lies between the selection gates SG1 and SG2 differ from the insulating material 152 filled in regions S1 and S2, the region S1 lying between the selection gate SG1 and the cell transistor and the region S2 lying between the selection gate SG2 and the cell transistor. The insulating material 151 filled in the region CB may contain impurities such P or B and may have a lower melting point than the insulating material 152.

FIGS. 15A to 15D explains a method of manufacturing a semiconductor memory according to a second embodiment of this invention.

In the first embodiment described above, the conductive member CM that connects the selection gates SG has a smaller width than the selection gates SG. In the second embodiment, the member CM has the same width as the selection gates SG as is seen from FIG. 15D.

The method of manufacturing the semiconductor memory according to the second embodiment will be described, with reference to FIGS. 15A to 15D. The steps performed to the forming of the control gates are identical to those of the first embodiment, and will not be described.

As FIG. 15A shows, a mask pattern 41 is formed on the entire upper surface of the structure after control gates CG have been formed. Note that the mask pattern 41 will be used to make a trench in which a conductive member should be embedded. The mask pattern 41 has an opening 41a, which exposes a region broader than the selection gate.

As FIG. 15B depicts, the mask layer 14 and polysilicon layer 13 are etched, using the mask pattern 41 as mask. A trench 42 is thereby made in the layers 14 and 13. The bottom of the trench 42 lies at a level between the bottom of the mask layer 14 and the gate insulating film 12.

Next, as illustrated in f 15C, a polysilicon layer, which will be processed to provide a conductive member CM, is embedded in the trench 42. The polysilicon layer is made flat at the top, by means of dry etching or CMP. Then, a mask pattern 43, which will be used to form selection gates SG, is formed on the entire upper surface of the resultant structure. The mask pattern 43 has a pattern 43a. The pattern 43a is narrower than the trench 42 and as broad as the selection gates SG that will be formed. The pattern 43a will be used to provide the section gates SG.

As shown in FIG. 15D, the conductive member CM, polysilicon layer 13, mask layer 14 and gate insulating film 12 are etched by using the mask pattern 43a as mask. Selection gates SG are thereby formed, each composed of a part of the polysilicon layer 13 and a part of conductive member CM.

The second embodiment described above can achieve the same advantages as the first embodiment.

In the second embodiment, the conductive member CM has the same width as the selection gates SG. The conductive member CM can therefore have a lower resistance than in the first embodiment. This can not only reduces the control voltage of the selection gates SG, but also increase the operating speed of the selection gates SG.

Moreover, the margin for the mask-alignment error can be broad because the conductive member CM has a larger width than the selection gates SG. This makes it easy to form the selection gates SG.

Figure 16:
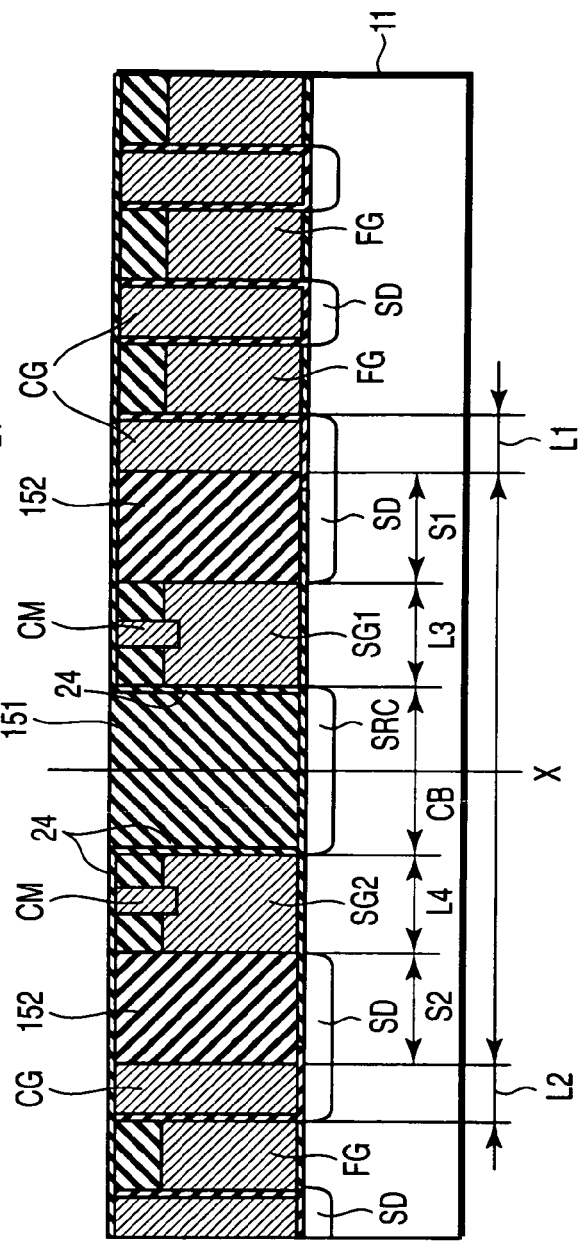
FIG. 16 is a sectional view depicting a modification of the memory illustrated in FIG. 14.

The position of the barrier film 24 is not limited to the one shown in FIG. 14. As FIG. 16 depicts, barrier films 24 may be formed on the sides of the selection gates SG1 and SG2 which oppose each other, and no barrier film 24 may be formed on those sides of the selection gates SG1 and SG2 which oppose the cell transistors. To provide this arrangement, a layer of insulating material 152 is formed between the regions S1 and S2, and a barrier film 24 is formed on the entire upper surface of the resultant structure. As described above, the region S1 lies between the selection gate SG1 and the cell transistor, and the region S2 lies between the selection gate SG2 and the cell transistor.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:

a semiconductor substrate:

a plurality of first cell transistors which are arranged in rows and columns on the semiconductor substrate;

a plurality of first selection gates which are provided on the semiconductor substrate and select rows of first transistors; and element-isolating regions which are provided adjacent to columns of the first selection gates and columns of the first cell transistors and which isolate the first selection gates and the first cell transistors;

each of the first cell transistors including:

a floating gate which is formed on a gate insulating film provided on the semiconductor substrate;

source-drain regions which are provided in the semiconductor substrate and formed on those sides of the floating gate which face each other in a column direction;

an inter-gate insulating film which is provided on one side of the floating gate; and a control gate which is provided on the inter-gate insulating film and above those sides of the floating gate which face each other in the column direction, wherein each of the first selection gates is provided on the gate insulating film, has a mask layer made of insulating film and provided on the top, a trench made in the mask layer and a conductive member provided in the trench, and is connected to adjacent first selection gates by the conductive member.

2. The device according to claim 1, wherein the conductive member has a bottom which lies between a bottom of the mask layer and the gate insulating film.

3. The device according to claim 1, wherein one end of the conductive member is located in a surface region of one element-isolating region and is connected to a contact provided on the element-isolating region.

4. The device according to claim 1, further comprising:
a plurality of second selection gates which are provided adjacent to the first selection gates and arranged on those sides of the first selection gates which face away from the first cell transistors; and
a plurality of second cell transistors which are arranged on those sides of the second selection gates which face away from the first selection gates.
wherein a difference in width between the first selection gates and the second selection gates is smaller than a difference in width between the control gates of the cell transistors located adjacent to the first selection gates and the control gates of the second cell transistors located adjacent to the second selection gates.

5. The device according to claim 4, wherein insulating material embedded in regions lying between the first and second selection gates is different from insulating material provided in regions lying between the control gates of the first and second cell transistors, the first cell transistors being adjacent to the first selection gates, and the second cell transistors being adjacent to the second selection gates.

6. The device according to claim 4, wherein the source-drain regions of any adjacent floating gates are connected and constitute a NAND-type semiconductor memory device.

7. The device according to claim 2, wherein the control gates of the cell transistors isolated by the element-isolating regions are connected to one another, forming a word line.

8. The device according to claim 3, the conductive member is a polysilicon layer.

9. The device according to claim 3, wherein the conductive member is a silicide layer.

* * * * *